United States Patent
Malik et al.

(10) Patent No.: US 8,187,377 B2
(45) Date of Patent: May 29, 2012

(54) NON-CONTACT ETCH ANNEALING OF STRAINED LAYERS

(75) Inventors: Igor J. Malik, Palo Alto, CA (US); Sien G. Kang, Dublin, CA (US); Martin Fuerfanger, San Jose, CA (US); Harry Kirk, Campbell, CA (US); Ariel Flat, Palo Alto, CA (US); Michael Ira Current, San Jose, CA (US); Philip James Ong, Milpitas, CA (US)

(73) Assignee: Silicon Genesis Corporation, San Jose, CA (US)

( * ) Notice: Subject to any disclaimer, the term of this patent is extended or adjusted under 35 U.S.C. 154(b) by 1432 days.

(21) Appl. No.: 10/264,393

(22) Filed: Oct. 4, 2002

(65) Prior Publication Data

US 2004/0067644 A1 Apr. 8, 2004

(51) Int. Cl.
*C30B 33/00* (2006.01)
(52) U.S. Cl. ............. 117/3; 117/97; 117/928; 117/939; 438/689; 438/706
(58) Field of Classification Search ................ 117/3, 97, 117/928, 939; 438/689, 706
See application file for complete search history.

(56) References Cited

U.S. PATENT DOCUMENTS

| | | | |
|---|---|---|---|
| 2,614,055 A | 10/1952 | Senarelens | |
| 3,117,002 A | 1/1964 | Bronson et. al. | |
| 3,225,820 A | 12/1965 | Riordan | |
| 3,390,033 A | 6/1968 | Brown | |
| 3,392,069 A | 7/1968 | Merkel et al. | |
| 3,551,213 A | 12/1970 | Boyle | |
| 3,770,499 A | 11/1973 | Crowe et al. | |
| 3,786,359 A | 1/1974 | King | |
| 3,806,380 A | 4/1974 | Kitada et al. | |
| 3,832,219 A | 8/1974 | Nelson et. al. | |
| 3,900,636 A | 8/1975 | Curry et al. | |
| 3,901,423 A | 8/1975 | Hillberry et al. | |
| 3,915,757 A | 10/1975 | Engel | |
| 3,946,334 A | 3/1976 | Yonezu | |
| 3,957,107 A | 5/1976 | Altoz et al. | |
| 3,964,957 A | 6/1976 | Walsh | |
| 3,993,909 A | 11/1976 | Drews et al. | |
| 4,006,340 A | 2/1977 | Gorinas | |
| 4,039,416 A | 8/1977 | White | |

(Continued)

FOREIGN PATENT DOCUMENTS

EP 084287 A1 7/1983

(Continued)

OTHER PUBLICATIONS

Mantl et al. "Strain relaxation of epitaxial SiGe layers on Si (100) improved by hydrogen implantation". Nuclear Instruments and Methods in Physics Research B 147 (1999) pp. 29-34.*

(Continued)

*Primary Examiner* — Matthew Song
(74) *Attorney, Agent, or Firm* — Kilpatrick Townsend & Stockton LLP

(57) ABSTRACT

The present invention provides for treating a surface of a semiconductor material. The method comprises exposing the surface of the semiconductor material to a halogen etchant in a hydrogen environment at an elevated temperature. The method controls the surface roughness of the semiconductor material. The method also has the unexpected benefit of reducing dislocations in the semiconductor material.

20 Claims, 5 Drawing Sheets

U.S. PATENT DOCUMENTS

| | | | |
|---|---|---|---|
| 4,074,139 A | 2/1978 | Pankove |
| 4,107,350 A | 8/1978 | Berg et al. |
| 4,108,751 A | 8/1978 | King |
| 4,116,751 A | 9/1978 | Zaromb |
| 4,121,334 A | 10/1978 | Wallis |
| 4,170,662 A | 10/1979 | Weiss et al. |
| 4,216,906 A | 8/1980 | Olsen et al. |
| 4,237,601 A | 12/1980 | Woolhouse et al. |
| 4,244,348 A | 1/1981 | Wilkes |
| 4,252,837 A | 2/1981 | Auton |
| 4,255,208 A | 3/1981 | Deutscher et al. |
| 4,274,004 A | 6/1981 | Kanai |
| 4,342,631 A | 8/1982 | White et al. |
| 4,346,123 A | 8/1982 | Kaufmann |
| 4,361,600 A | 11/1982 | Brown |
| 4,368,083 A | 1/1983 | Bruel et al. |
| 4,412,868 A | 11/1983 | Brown et al. |
| 4,452,644 A | 6/1984 | Bruel et al. |
| 4,468,309 A | 8/1984 | White |
| 4,471,003 A | 9/1984 | Cann |
| 4,486,247 A | 12/1984 | Ecer et al. |
| 4,490,190 A | 12/1984 | Speri |
| 4,495,219 A | 1/1985 | Kato et al. |
| 4,500,563 A | 2/1985 | Ellenberger et al. |
| 4,508,056 A | 4/1985 | Bruel et al. |
| 4,530,149 A | 7/1985 | Jastrzebski et al. |
| 4,536,657 A | 8/1985 | Bruel |
| 4,539,050 A | 9/1985 | Kramler et al. |
| 4,566,403 A | 1/1986 | Fournier |
| 4,567,505 A | 1/1986 | Pease et al. |
| 4,568,563 A | 2/1986 | Jackson et al. |
| 4,585,945 A | 4/1986 | Bruel et al. |
| 4,684,535 A | 8/1987 | Heinecke et al. |
| 4,704,302 A | 11/1987 | Bruel et al. |
| 4,717,683 A | 1/1988 | Parrillo |
| 4,727,047 A | 2/1988 | Bozler et al. |
| 4,764,394 A | 8/1988 | Conrad |
| 4,837,172 A | 6/1989 | Mizuno et al. |
| 4,846,928 A | 7/1989 | Dolins et al. |
| 4,847,792 A | 7/1989 | Barna et al. |
| 4,853,250 A | 8/1989 | Boulos et al. |
| 4,883,561 A | 11/1989 | Gmitter et al. |
| 4,887,005 A | 12/1989 | Rough et al. |
| 4,891,329 A | 1/1990 | Reismann et al. |
| 4,894,709 A | 1/1990 | Phillips et al. |
| 4,906,594 A | 3/1990 | Yoneda |
| 4,931,405 A | 6/1990 | Kamijo et al. |
| 4,948,458 A | 8/1990 | Ogle |
| 4,952,273 A | 8/1990 | Popov |
| 4,960,073 A | 10/1990 | Suzuki et al. |
| 4,982,090 A | 1/1991 | Wittmaack |
| 4,983,251 A | 1/1991 | Haisma et al. |
| 4,996,077 A | 2/1991 | Moslehi et al. |
| 5,015,353 A | 5/1991 | Hubler et al. |
| 5,034,343 A | 7/1991 | Rouse et al. |
| 5,070,040 A | 12/1991 | Pankove |
| 5,082,793 A | 1/1992 | Li |
| 5,102,821 A | 4/1992 | Moslehi |
| 5,110,748 A | 5/1992 | Sarma |
| 5,133,826 A | 7/1992 | Dandl |
| 5,196,355 A | 3/1993 | Wittkower |
| 5,198,371 A | 3/1993 | Li |
| 5,202,095 A | 4/1993 | Houchin et al. |
| 5,203,960 A | 4/1993 | Dandl |
| 5,206,749 A | 4/1993 | Zavracky et al. |
| 5,213,451 A | 5/1993 | Frank |
| 5,234,529 A | 8/1993 | Johnson |
| 5,234,535 A | 8/1993 | Beyer et al. |
| 5,242,861 A | 9/1993 | Inaba |
| 5,250,328 A | 10/1993 | Otto |
| 5,252,178 A | 10/1993 | Moslehi |
| 5,256,562 A | 10/1993 | Vu et al. |
| 5,258,320 A | 11/1993 | Zavracky et al. |
| 5,258,325 A | 11/1993 | Spitzer et al. |
| 5,269,880 A | 12/1993 | Jolly et al. |
| 5,273,610 A | 12/1993 | Thomas, III et al. |
| 5,277,748 A | 1/1994 | Sakaguchi et al. |
| 5,303,574 A | 4/1994 | Matossian et al. |
| 5,304,509 A | 4/1994 | Sopori |
| 5,308,776 A | 5/1994 | Gotou |
| 5,317,236 A | 5/1994 | Zavracky et al. |
| 5,342,472 A | 8/1994 | Imahashi et al. |
| 5,344,524 A | 9/1994 | Sharma et al. |
| 5,354,381 A | 10/1994 | Sheng |
| 5,362,671 A | 11/1994 | Zavracky et al. |
| 5,363,603 A | 11/1994 | Miller et al. |
| 5,368,710 A | 11/1994 | Chen et al. |
| 5,370,765 A | 12/1994 | Dandl |
| 5,374,564 A | 12/1994 | Bruel |
| 5,376,560 A | 12/1994 | Aronowitz et al. |
| 5,377,031 A | 12/1994 | Vu et al. |
| 5,404,079 A | 4/1995 | Ohkuni et al. |
| 5,405,480 A | 4/1995 | Benzing et al. |
| 5,411,592 A | 5/1995 | Ovshinsky et al. |
| 5,413,679 A | 5/1995 | Godbey |
| 5,435,880 A | 7/1995 | Minato et al. |
| 5,438,241 A | 8/1995 | Zavracky et al. |
| 5,444,557 A | 8/1995 | Spitzer et al. |
| 5,459,016 A | 10/1995 | Debe et al. |
| 5,475,514 A | 12/1995 | Salerno et al. |
| 5,476,691 A | 12/1995 | Komvopoulos et al. |
| 5,480,842 A | 1/1996 | Clifton et al. |
| 5,487,785 A | 1/1996 | Horiike et al. |
| 5,494,835 A | 2/1996 | Bruel |
| 5,504,328 A | 4/1996 | Bonser |
| 5,528,397 A | 6/1996 | Zavracky et al. |
| 5,539,245 A | 7/1996 | Imura et al. |
| 5,558,718 A | 9/1996 | Leung |
| 5,559,043 A | 9/1996 | Bruel |
| 5,569,620 A | 10/1996 | Linn et al. |
| 5,581,385 A | 12/1996 | Spitzer et al. |
| 5,585,304 A | 12/1996 | Hayashi et al. |
| 5,611,855 A | 3/1997 | Wijaranakula |
| 5,643,834 A | 7/1997 | Harada et al. |
| 5,653,811 A | 8/1997 | Chan |
| 5,659,187 A | 8/1997 | Legoues |
| 5,705,421 A | 1/1998 | Matsushita et al. |
| 5,710,057 A | 1/1998 | Kenney |
| 5,714,395 A | 2/1998 | Bruel |
| 5,744,852 A | 4/1998 | Linn et al. |
| 5,755,914 A | 5/1998 | Yonehara |
| 5,763,319 A | 6/1998 | Ling et al. |
| 5,783,022 A | 7/1998 | Cha et al. |
| 5,793,913 A * | 8/1998 | Kovacic ........................ 385/49 |
| 5,804,086 A | 9/1998 | Bruel |
| 5,824,595 A | 10/1998 | Igel et al. |
| 5,827,751 A | 10/1998 | Nuyen |
| 5,854,123 A | 12/1998 | Sato et al. |
| 5,869,387 A | 2/1999 | Sato et al. |
| 5,877,070 A | 3/1999 | Goesele et al. |
| 5,882,987 A | 3/1999 | Srikrishnan |
| 5,909,627 A | 6/1999 | Egloff |
| 5,920,764 A | 7/1999 | Hanson et al. |
| 5,953,622 A | 9/1999 | Lee et al. |
| 5,966,620 A | 10/1999 | Sakaguchi et al. |
| 5,985,742 A | 11/1999 | Henley et al. |
| 5,993,677 A | 11/1999 | Biasse et al. |
| 5,994,207 A | 11/1999 | Henley et al. |
| 6,013,563 A | 1/2000 | Henley et al. |
| 6,013,567 A | 1/2000 | Henley et al. |
| 6,020,052 A | 2/2000 | Aspar et al. |
| 6,020,252 A | 2/2000 | Aspar et al. |
| 6,033,974 A | 3/2000 | Henley et al. |
| 6,039,803 A | 3/2000 | Fitzgerald et al. |
| 6,048,411 A | 4/2000 | Henley et al. |
| 6,077,383 A | 6/2000 | Laporte |
| 6,083,324 A | 7/2000 | Henley et al. |
| 6,107,653 A | 8/2000 | Fitzgerald |
| 6,120,597 A | 9/2000 | Levy et al. |
| 8,150,239 B2 | 11/2000 | Goesele et. al. |
| 6,159,824 A | 12/2000 | Henley et al. |
| 6,171,965 B1 | 1/2001 | Kang |
| 6,184,111 B1 | 2/2001 | Henley et al. |
| 6,214,701 B1 | 4/2001 | Matsushita et al. |
| 6,225,192 B1 | 5/2001 | Aspar et al. |
| 6,287,941 B1 * | 9/2001 | Kang et al. ................ 438/459 |
| 6,291,321 B1 | 9/2001 | Fitzgerald |

| | | | |
|---|---|---|---|
| 6,455,397 B1 | 9/2002 | Belford | |
| 6,503,773 B2 | 1/2003 | Fitzgerald | |
| 6,514,836 B2 | 2/2003 | Belford | |
| 6,563,152 B2 | 5/2003 | Roberts et al. | |
| 6,809,009 B2 | 10/2004 | Aspar et al. | |
| 2001/0039095 A1* | 11/2001 | Marty | 438/321 |
| 2002/0174828 A1 | 11/2002 | Stefanescu et al. | |
| 2005/0118754 A1 | 6/2005 | Henley et al. | |

FOREIGN PATENT DOCUMENTS

| | | |
|---|---|---|
| EP | 099778 A1 | 2/1984 |
| EP | 112238 A2 | 7/1984 |
| EP | 155875 A1 | 9/1985 |
| EP | 181249 A1 | 5/1986 |
| EP | 112230 B1 | 4/1987 |
| EP | 164281 B1 | 2/1989 |
| EP | 355913 A1 | 2/1990 |
| EP | 379828 A2 | 8/1990 |
| EP | 459177 A2 | 12/1991 |
| EP | 504714 A2 | 9/1992 |
| EP | 533551 A1 | 3/1993 |
| EP | 553852 A2 | 8/1993 |
| EP | 665588 A1 | 2/1995 |
| EP | 660140 A1 | 6/1995 |
| EP | 665587 A1 | 8/1995 |
| EP | 703609 A1 | 3/1996 |
| EP | 763849 A1 | 3/1997 |
| EP | 807970 A1 | 11/1997 |
| EP | 867917 A2 | 9/1998 |
| EP | 867921 A2 | 9/1998 |
| EP | 905767 A1 | 3/1999 |
| EP | 961312 A2 | 12/1999 |
| EP | 1085562 A2 * | 3/2001 |
| FR | 1558881 | 2/1969 |
| FR | 2235474 A1 | 1/1975 |
| FR | 2261802 A1 | 9/1975 |
| FR | 2266304 A | 10/1975 |
| FR | 2298880 A1 | 8/1976 |
| FR | 22529383 A1 | 6/1982 |
| FR | 2519437 A1 | 7/1983 |
| FR | 2537768 A1 | 8/1985 |
| FR | 2560426 A1 | 8/1985 |
| FR | 2563377 A1 | 10/1985 |
| FR | 2537777 A1 | 4/1986 |
| FR | 2575601 A | 7/1986 |
| FR | 2681472 A1 | 3/1993 |
| FR | 2714524 A1 | 6/1995 |
| FR | 2715501 A1 | 7/1995 |
| FR | 2715502 A1 | 7/1995 |
| FR | 2715503 | 7/1995 |
| FR | 2720189 A1 | 11/1995 |
| FR | 2725074 A1 | 3/1996 |
| GB | 2 211991 A | 7/1989 |
| GB | 2 231197 A | 11/1990 |
| JP | 53-104156 A | 9/1978 |
| JP | 0193904 A | 4/1983 |
| JP | 58-144475 A2 | 8/1983 |
| JP | 59-046750 A2 | 3/1984 |
| JP | 59-054217 A | 3/1984 |
| JP | 59-114744 A | 7/1984 |
| JP | 59-139539 A2 | 10/1984 |
| JP | 60-083591 A | 5/1985 |
| JP | 60-207237 A2 | 10/1985 |
| JP | 60-235434 A2 | 11/1985 |
| JP | 3-109731 A | 5/1991 |
| JP | 3-132055 A | 6/1991 |
| JP | 3-265156 A | 11/1991 |
| JP | 4-246594 A | 9/1992 |
| JP | 4-298023 A | 10/1992 |
| JP | 4-076503 A | 11/1992 |
| JP | 5-211128 A | 8/1993 |
| JP | 7-215800 A | 8/1995 |
| JP | 7-254690 A | 10/1995 |
| JP | 7-263291 A | 10/1995 |
| JP | 8-097389 A | 4/1996 |
| JP | 61125012 | 6/1996 |
| JP | 10-200080 A | 7/1998 |
| JP | 11-045840 A | 2/1999 |
| JP | 2901031 B2 | 6/1999 |
| JP | 2910001 B2 | 6/1999 |
| JP | 2000-94317 A | 4/2000 |
| WO | WO 95/10718 A1 | 4/1995 |
| WO | WO 95/20824 A1 | 8/1995 |
| WO | WO 95/31825 A1 | 11/1995 |
| WO | WO 99/35674 A1 | 7/1999 |
| WO | WO 00/63965 | 10/2000 |
| WO | WO 01/54175 | 7/2001 |

OTHER PUBLICATIONS

Alles et al., Thin Film Silicon on Insulator: An Enabling Technology, Semiconductor International, pp. 67-72 (1997).
Basta, Ion-Beam Implantation, High Technology, (1985).
Burggraff, Advanced Plasma Source: What's Working?, Semiconductor International, pp. 56-59 (May 1994).
Carter et al., The Collection of IONS Implanted in Semiconductors Radiation Effects, *Abstract only*, vol. 16 Nos. 1-2, pp. 107-114 (Sep. 1972).
Cassidy, Ion Implantation Process Toughens Metalworking Tools, Modern Metals, pp. 65-67 (1984).
Cheung, Plasma Immersion Ion Implantation for Semiconductor Processing, Material Chemistry and Physics, 46(2-3): 132-139 (1996).
Choyke et al., Mechanical Response of Single Crystal Si to Very High Fluence H+ Implantation, Nuc. Instr. Meth., 209-210:407-412 (1983).
Choyke et al., Implanted Hydrogen Effects at High Concentrations in Model Low Z Shielding Materials, J. Nuc. Mtrls., 122-23:1585-86 (1984).
Choyke et al., A Comparative Study of Near-Surface Effects Due to Very High Fluence H+ Implantation in Single Crystal FZ, CZ, and Web SI, Mat. Res. Soc. Symp. Proc., 27:359-364 (1984).
Chu et al., Plasma Immersion Ion Implantation—A Fledgling Technique for Semiconductor Processing, Materials Science and Engineering Reports: A Review Journal, R17(6-7): 207-280 (1996).
Chu et al., Recent Applications of Plasma Immersion Ion Implantation, Semiconductor International, pp. 165-172 (1996).
Chu, Synthesis of SOI Materials Using Plasma Immersion Ion Implantation, 1997 Mat. Res. Soc. Symp. Proc.,438:333-343 (1997).
Corbett et al., Embrittlement of Materials: Si(H) as a Model System, J. Nuc. Mtrls., 169: 179-184 (1989).
Grovernor, C.R.M., Microelectric Materials (1989), pp. 73-75.
Hulett et al., Ion Nitriding and Ion Implantation: A Comparison, Metal Progress, pp. 18-21 (1985).
I.B.M., Technical Disclosure Bulletin, vol. 29: No. 3, p. 1416 (Aug. 1986).
Johnson et al., Hydrogen-Induced Platelets in Silicon: Separation of Nucleation and Growth, Mtrls. Sci. Forum, 83-87:33-38 (1992).
Lee et al., A Novel Pattern Transfer Process for Bonded SOI Giga-bit DRAMS, 1996 IEEE Int'l. SOI Conference Proceedings, IEEE Electron Devices Society, (1996.).
Li, Novel Semiconductor Substrate Formed by Hydrogen Ion Implantation into Silicon, Appl. Phys. Lett., 55(21):2223-2224 (1989).
Lu et al., SOI Material Technology Using Plasma Immersion Ion Implantation, Proceedings 1996 IEEE International SOI Conference (Oct. 1996).
Mahajan et al., Principles of Growth and Processing Semiconductors, WCB McGraw-Hill, chapter 6, pp. 262-269.
Matsuda et al., Large Diameter Ion Beam Implantation System, Nuclear Instruments and Methods, B21:314-316 (1987).
Milnes et al., Peeled Film Technology for Solar Cells, pp. 338-341.
Moreau, Semiconductor Lithography, Principles, Practices, and Materials, Plenum Press (1988).
Moriceau et al., Hydrogen Annealing Treatment Used to Obtain High Quality SOI Surfaces, Proceedings of 1998 IEEE Int. SOI Conference, pp. 37-38 from conference held Oct. 5-8, 1998.
Oshima et al., Defects in Si Irradiated with D-T neutrons, D and He Ions, J. Nuc. Mtrls., 179-181:947-950 (1991).
Patent Abstracts of Japan, vol. 7, No. 107 (E-174), (May 11, 1993) JP-58-030145 (Feb. 22, 1983).
Picraux et al., Ion Implantation of Surfaces, Scientific American, 252(3):102-113 (1985).

Renier et al., A New Low-Energy Ion Implanter for Bombardment of Cylindrical Surfaces, Vacuum, 35(12):577-578 (1985).

Sato et al., Suppression of Si Etching During Hydrogen Annealing of Silicon-on-Insulator, Proceedings of 1998 IEEE Int. SOI Conference, pp. 17-18 from conference held Oct. 5-8, 1998.

Sioshansi, Ion Beam Modification of Materials for Industry, Thin Solid Film, 118:61-71 (1984).

Smith, Thin Film Deposition, McGraw-Hill Inc., pp. 185-196, 278-293.

Sze, VLSI Technology, 2nd Edition, pp. 9-101, (1988).

Tate et al., Defect Reduction of Bonded SOI Wafers by Post Anneal Process in H/sub 2/Ambient, Proceedings of 1998 IEEE Int. SOI Conference, pp. 141-142 from conference held Oct. 5-8, 1998.

Tong et al. Semiconductor Wafer Bonding: Science and Technology, John Wiley & Sons, Inc., pp. 152-171.

U.S. Dept. of Energy, The Fusion Connection, Plasma Coating, pp. 6-7 (1985).

Veldkamp et al., Binary Optics, Scientific American, pp. 50-55 (May 1992).

Wolf, Silicon Processing for the VLSI Era vol. 2, pp. 66-79, Lattice Press (1990).

Adam et al., SOI as a Mainstream IC Technology, Proceedings 1998 IEEE International SOI Conference, Oct. 1998, pp. 9-12.

Belford et al., Performance-Augmented CMOS Using Back-end Uniaxial Strain, 2002 Device Research Conference, Santa Barbara, CA.

Comita et al., Low Temperature Si and SiGe Epitaxy for sub 01.μm Technology, AMAT Conference Paper, Mar. 10, 2003.

Chuang et al., Design Considerations of SOI Digital CMOS VLSI, Proceedings 1998 IEEE International SOI Conference, Oct. 1998, pp. 5-8.

Feijo et al., Pre stressing of Bonded Wafers, Proceedings of the First International Symposium on Semiconductor Wafer Bonding Science, Technology and Applications (Electrochemical Society, New York, 1992, v. 92.7, pp. 230-238.

Ge et al., Process-Strained Si (PSS) CMOS Technology Featuring 3D Strain Engineering, IEEE International Electron Devices Meeting, Washington, DC, Dec. 2003.

Hobuka et al., Change in Micro roughness of a Silicon Surface during in Situ Cleaning Using HF and HCL Gases, Journal of the Electrochemical Society, Electrochemical Society, Manchester, NY, v. 145, No. 12, Dec. 1998, pp. 4264-4271.

Onjima et al., Lattice Relaxation Process of A1N Growth on Atomically Flat 6H-SIC Substrate in Molecular Beam Epitaxy, Journal of Crystal Growth, North-Holland Publishing Co., Amsterdam, NL, v. 2370239, Apr. 2002, pp. 1012-1016.

QE's Smooth Approach Increases Carrier Mobilities, News, www.compoundsemiconductor.net, Dec. 2004.

Saenger, et al., Amorphization/templated recrystallization Method for Changing the Orientation of Single-Crystal Silicon: An Alternative Approach to Hybrid Orientation Substrates, Appl. Phys. Lett. 87, 221911, 2005.

Thompson, Strained Silicon MOSFETs: The Next Material Change to Extend Moore's Law, University of Florida, Spring MRS 2004.

Yaguchi et al., Strain Relaxation in MBE-Grown SI1-SGEX/SU (100) Heterostructures by Annealing, Japanese Journal of Applied Physics, Tokyo, JP, v. 30, No. 8B Part 2, Aug. 1991, pp. L1450-L1453.

Yang et al., On the Integration of CMOS with Hybrid Crystal Orientations, 2004 Symposium on VLSI Technology Digest of Technical Papers, 2004.

Yang et al., High Performance CMOS Fabricated on Hybrid Substrate with Different Crystal Orientations, IEDM Tech. Dig., 2003, pp. 453-456.

Gao et al. "Surface Roughening of Heteroepitaxial Thin Films" Annu. Rev. Mater. Sci., (1999), vol. 29, pp. 173-209.

* cited by examiner

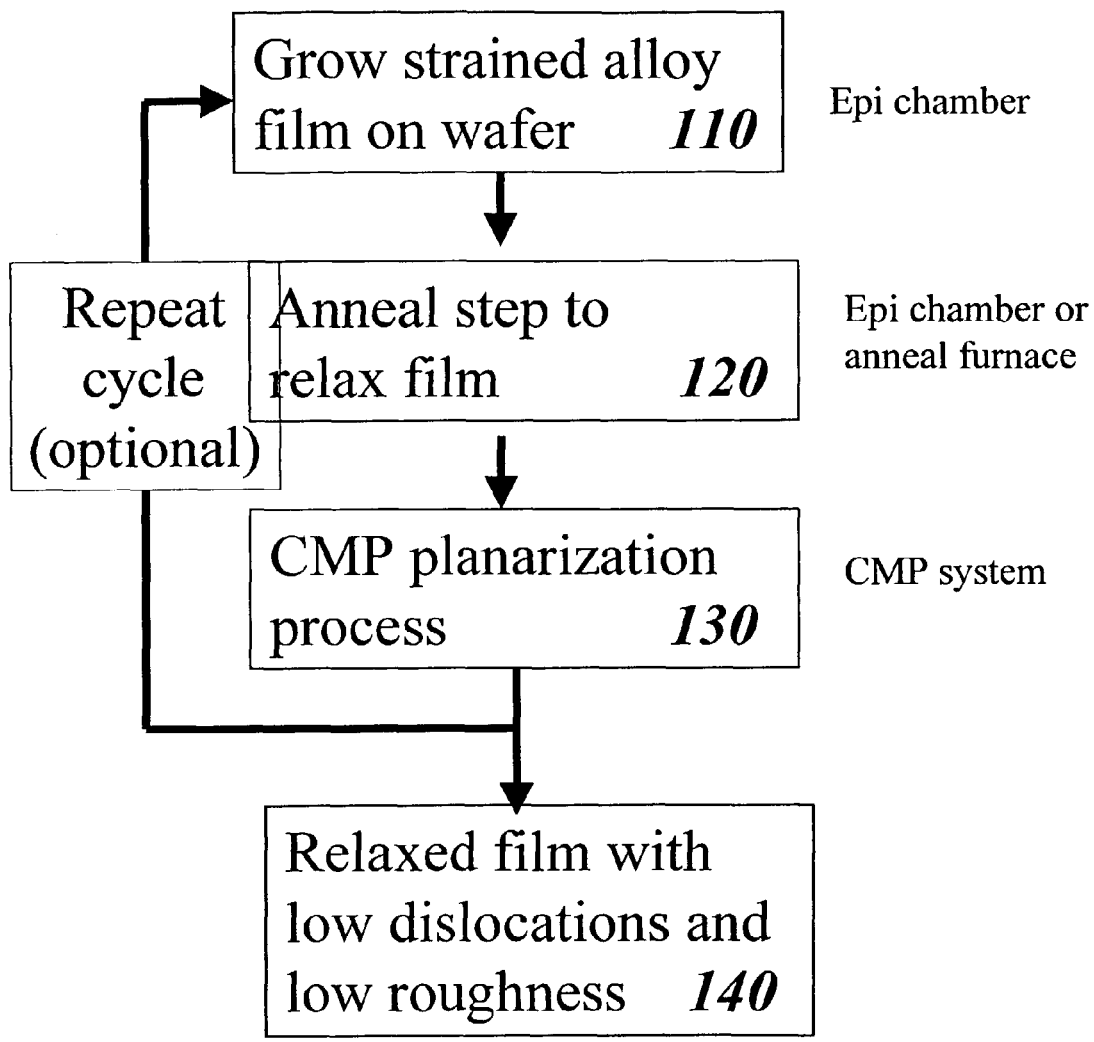
Figure 1: Prior art.

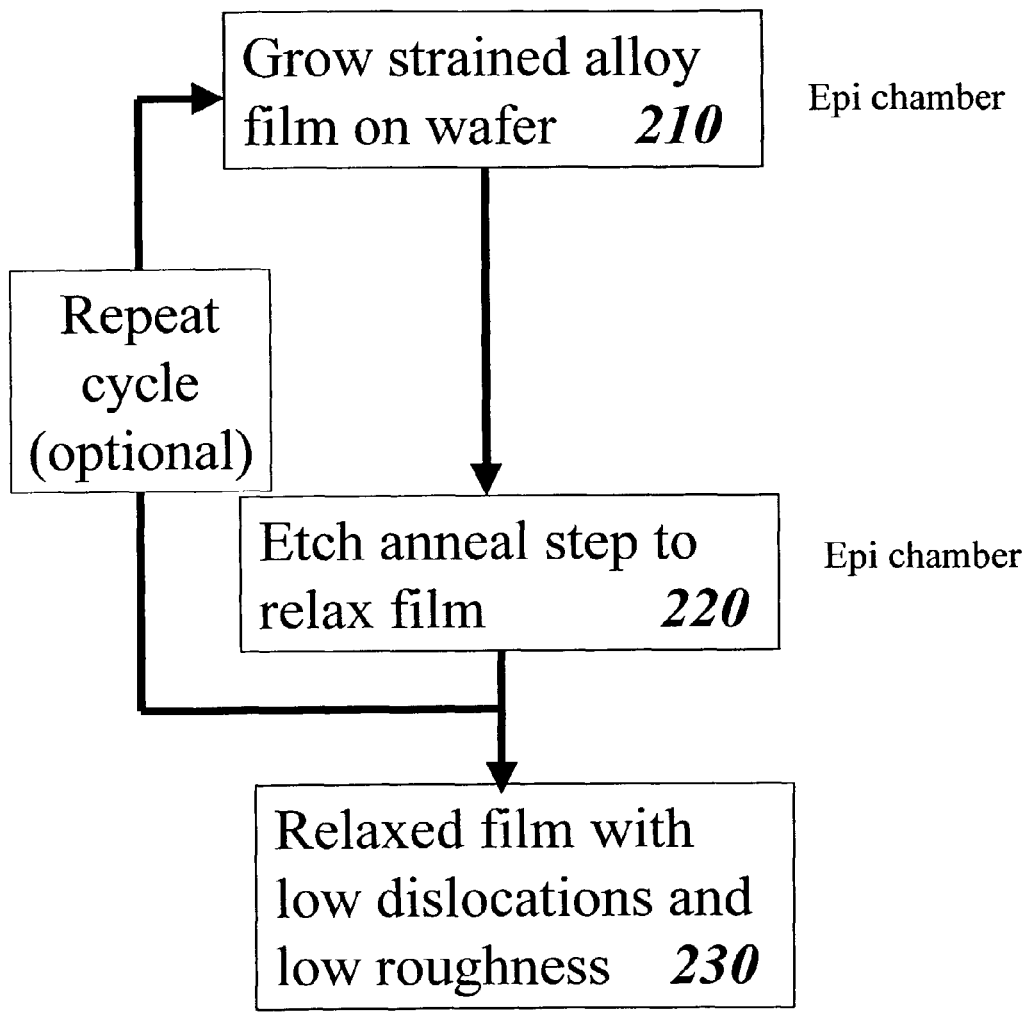
Figure 2: Preferred embodiment.

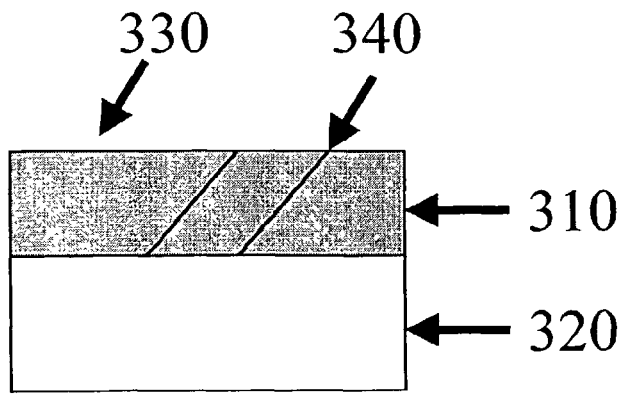
3A. As-grown, strained silicon germanium layer
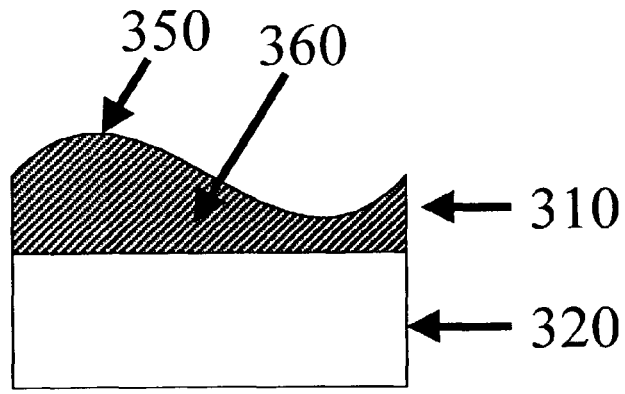
3B. Relaxed silicon germanium layer after anneal
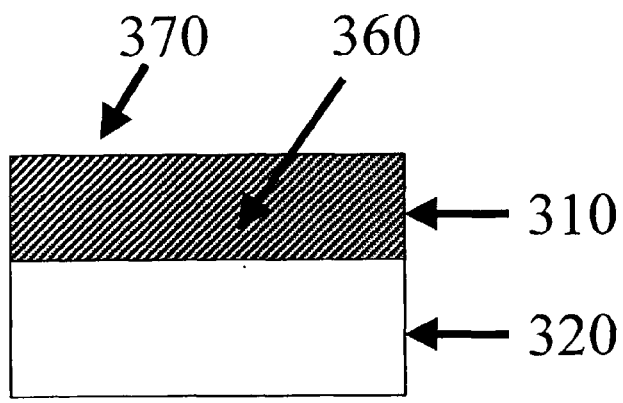
3C. Relaxed silicon germanium layer after CMP
Figure 3: Detailed cross-section views of prior art.

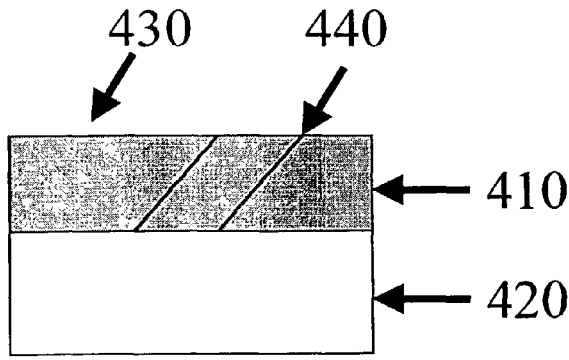
4A. As-grown, strained silicon germanium layer
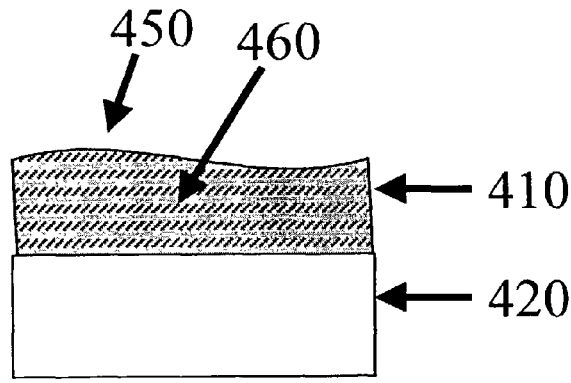
4B. Relaxed silicon germanium layer after etch annealing
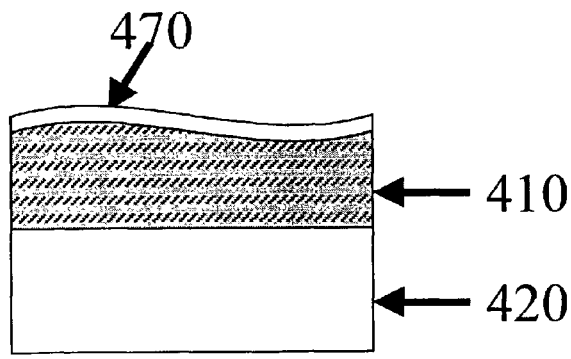
4C. Strained silicon layer grown on relaxed silicon germanium
Figure 4: Strained silicon layer process according to the preferred embodiment.

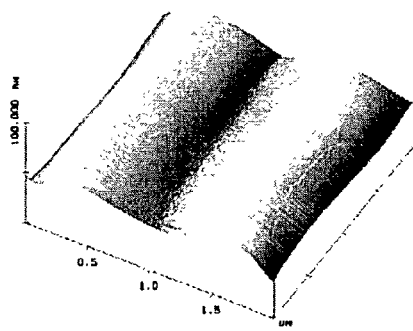
Fig 5A: Thermal anneal
(1100 C, 300 sec)
RMS roughness = 61 A
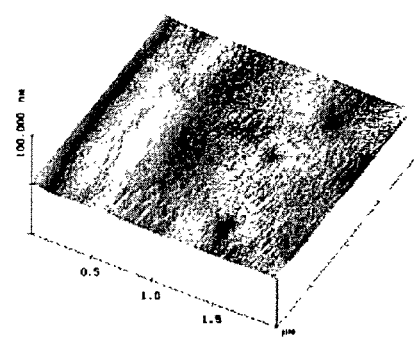
Fig 5B: Etch anneal
(1100 C, 300 sec with HCl)
RMS roughness = 6 A
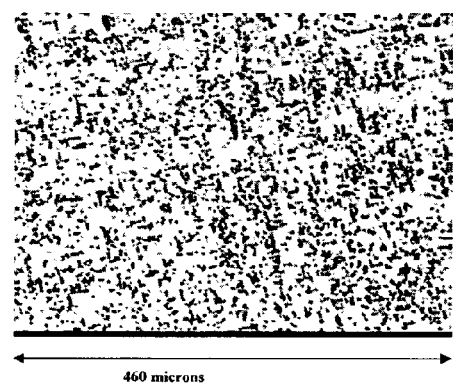
Fig 6A: Thermal anneal
(1100 C, 300 sec)
Dislocations= $3.2 \times 10^6$ /cm$^2$
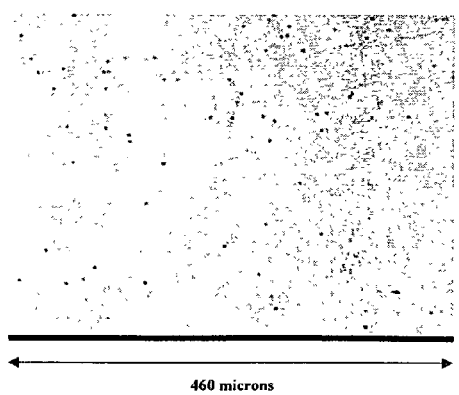
Fig 6B: Etch anneal
(1100 C, 300 sec with HCl)
Dislocations= $4.6 \times 10^4$ /cm$^2$

NON-CONTACT ETCH ANNEALING OF STRAINED LAYERS

FIELD OF THE INVENTION

Embodiments of the present invention relate to controlling the growth and morphology of surface roughness during an annealing and relaxation process of strained films, and more particularly to decreasing surface crystalline dislocations during a relaxation process.

BACKGROUND OF THE INVENTION

In the conventional art, many semiconductor device fabrication processes utilize planar surfaces. Furthermore, as semiconductor fabrication technology progresses, increasing carrier mobility and decreasing lattice dislocation density become increasingly critical. Improving device yields by reducing dislocations provides for improved manufacturing efficiencies and cost.

In the conventional art, a silicon layer is used as the active device medium upon which semiconductor devices are fabricated. Single-crystal silicon has a specific carrier mobility value that is fundamental to the material. The mobility value is a key parameter in many active semiconductor devices. Often, it is desired to enhance or increase the device carrier mobility value to increase the switching speed and therefore the performance of the fabricated devices such as transistors. Because of the many fundamental and specific advantages in utilizing silicon as the semiconductor material, it is highly desirable to adopt methods to enhance silicon mobility instead of utilizing higher mobility materials that are harder to process such as Germanium or Galium Arsenide.

One practical method of enhancing silicon mobility is by straining the silicon layer. By placing the active silicon under tension, as demonstrated for N-type MOSFET transistors [paper on strained MOS IDSAT . . . ], significantly higher mobility resulting in higher device switching speed and drive currents can be achieved.

A method of generating such tensile strained silicon involves growing the silicon layer epitaxially above a relaxed silicon germanium film of a specific composition. This effect occurs because the silicon lattice constant, about 5.45 Angstroms, is smaller than the lattice constant of a fully relaxed silicon germanium alloy film. Such alloys can be engineered to have a lattice spacing linearly varying from 5.45 Angstroms (100% silicon) to 5.65 Angstroms (100% germanium). For the pure germanium film, the lattice spacing is about 4% larger than pure silicon. Thus for example, a $Si_{0.75}Ge_{0.25}$ alloy (25% germanium content) would have a lattice constant about 1% larger than silicon.

The strained silicon film could therefore be advantageously fabricated by epitaxially growing the device silicon film on a relaxed silicon Germanium (SiGe) alloy film of the requisite composition.

A fundamental complication of this mobility enhancement approach is the requirement of a relaxed SiGe film. If the SiGe film is grown onto a base silicon wafer, the film will first grow in a lattice-matched manner as a compressive layer. This means that the SiGe alloy will be compressed to the natural silicon lattice spacing and will itself be strained. Since the function of the alloy film requires a relaxation of the compressive strain, there must be a step where the SiGe alloy is relaxed to its unstrained state. Such a step necessarily introduces numerous dislocations in the SiGe layer to accommodate the lattice spacing and volume increase. The film also usually "buckles" and roughens significantly during this relaxation process.

The major parameters characterizing a practical relaxed SiGe alloy film include the amount that the film has been relaxed from its strained state (i.e. 50% relaxation would mean that the film has relaxed half of its strain), the roughness of the film, and the dislocation defect density that would be affecting the subsequent growth of the strained silicon device film.

The surface dislocation density is a critical parameter affecting the electrical properties of semiconductor materials since they are highly dependent upon crystalline defects. Dislocations can comprise insertion of an extra half-plane of atoms into a regular crystal structure, displacement of whole rows of atoms from their regular lattice position, and/or displacement of one portion of the crystal relative to another portion of the crystal. Dislocations present on the device layer can tend to short-circuit p-n junctions and also scatter electrons in a uniform n-type crystal, impeding their motion and reducing their mobility. Dislocations also cause highly localized distortion of the crystal lattice leading to the formation of "trapping" sites where the recombination of positive (holes) and negative (electrons) carriers is enhanced. This may cause, for example, the electrons from the n-p-n transistor emitter to recombine with holes in the p-type base regions before they can be collected at the n-type collector region, reducing the transistor current gain. This electron "lifetime" may be significantly reduced when as few as one out of $10^{11}$ atoms/cm3 of silicon are removed from their normal lattice sites by recombination. Although some dislocations can be removed from a semiconductor material by thermal annealing, many dislocations are permanent and thermally stable. Many of the relaxation approaches are therefore tuned to minimize the defect density of the type that can be translated to the device layer and cause device performance degradation, failure and yield losses.

In one method according to the conventional art, the SiGe alloy is grown with a slowly varying grade from 0% germanium to the required alloy composition at a sufficiently low temperature to grow a dislocation free initial film and through subsequent annealing, the slow gradient helps to accommodate film relaxation through the generation of dislocations that are buried within the SiGe layer. This technology is explained in Legoues & al. (U.S. Pat. No. 5,659,187 "Low defect density/arbitrary lattice constant heteroepitaxial layers"). To limit the production of dislocations threading to the surface, the SiGe grade is usually less than 2% composition increase per 1000 Angstroms of SiGe film growth. This shallow gradient approach is lower in productivity due to its relatively thick SiGe layer composition and may require numerous growth/anneal cycles to achieve roughness and dislocation goals.

In yet another method according to the conventional art, the surface roughness or the SiGe alloy layer can be reduced using a chemical mechanical polishing (CMP) process such as taught by Fitzgerald (U.S. Pat. No. 6,291,321 "Controlling threading dislocation densities in Ge on Si using graded GeSi layers and planarization" and U.S. Pat. No. 6,107,653, "Controlling threading dislocation densities in Ge on Si using graded GeSi layers and planarization"). CMP utilizes a combination of vertical force between a wafer and an abrasive pad as well as a chemical action of a slurry, to polish the surface of the wafer to a highly planar state. The roughness of the resulting semiconductor surface can typically be reduced to approximately 1 Angstrom RMS when measured by an Atomic Force Microscope (AFM). However, CMP is relatively costly as a result of the slurry and the amount of time it takes to perform the process. Furthermore, the CMP process does not generally reduce the dislocation density in the wafer. Finally, this linear growth/anneal/CMP sequence is costly as it requires numerous sequential process and wafer handling steps.

Another method uses miscut wafers to help the grown film to relax as much as possible and accommodate the lattice mismatches. See for example Fitzgerald & al. (U.S. Pat. No. 6,039,803, "Utilization of miscut substrates to improve relaxed graded silicon-germanium and germanium layers on silicon") that teaches the improvement of using base wafers having 1 to about 8 degrees of miscut from a true [100] orientation to help grow a less defective, relaxed layer of a second semiconductor material. Although the base substrate miscut can improve the relaxed defect density to some extent, the improvements are generally considered insufficient for leading edge applications.

Referring to FIG. 1, a flow diagram of a process according to the conventional art is shown. This process produces a relaxed film of SiGe alloy material by first growing a strained film on a base wafer 110, subjecting the strained film to an anneal step to relax the film and concurrent generation of surface roughening (buckling) and dislocations 120, followed by a planarization smoothing step such as CMP 130. The use of an epitaxial step such as CVD (Chemical Vapor Deposition) or MBE (Molecular Beam Epitaxy) followed by a planarization step such as CMP significantly complicates the film relaxation preparation process since multiple equipment, cleans, and wafer handling are required. This in turn would increase the manufacturing cost of the relaxed film fabrication process.

Referring now to FIGS. 3A-3C, various sectional views of a semiconductor layer are shown to illustrate the anneal/CMP conventional art such as disclosed by Fitzgerald in more detail. As depicted in FIG. 3A, a single crystalline semiconductor surface formed by an epitaxial process wherein a strained SiGe film 310 is grown onto a base silicon wafer 320. The semiconductor layer is comprised of single crystalline silicon-germanium having a surface roughness 330 of approximately 1-2 Angstrom RMS. The silicon-germanium layer typically was grown at a sufficiently low temperature where the film is supercritically stressed but no relaxation has taken place. The dislocation defect density 340 is therefore very low, on the order of 1 dislocations/cm$^2$ or less.

As depicted in FIG. 3B, an anneal is performed on the substrate to relax the SiGe alloy film which generates substantial surface roughening 250 and dislocation defects 260. The resulting surface may have a buckled roughening 250 exceeding 200-300 Angstroms RMS and a dislocation defect density 260 exceeding approximately $10^7$ dislocations/cm$^2$.

As depicted in FIG. 3C, a separate CMP process generally reduces surface roughness 270 to approximately 1-5 Angstroms RMS. However, the CMP process generally does not decrease dislocations 260 in the silicon-germanium layer 310 and must be accompanied by comprehensive clean processes.

Thus, the conventional art is disadvantageous in that planarizing processes are relatively costly and time-consuming processes. The conventional art also suffers from relatively high levels of dislocations. A better and less costly approach that can fully relax strained SiGe alloy films while controlling surface roughness and dislocation defect levels is highly desirable.

SUMMARY OF THE INVENTION

A method for etch annealing a semiconductor layer is disclosed. In addition to its significant effect in controlling the roughness increases during the relaxation process, the method has the unexpected benefit of substantially reducing dislocations. The reduced dislocation density is advantageous in that carrier mobility and yield are increased.

In one embodiment, the method includes exposing a surface of a strained, unrelaxed SiGe alloy layer to a mixture of hydrogen gas and a halogen gas, such as hydrogen chloride. The ratio of halogen gas to hydrogen is approximately 0.001 to 10. The process is performed at an elevated temperature of between 700-1200 C. The process is performed for a period of time sufficient to remove a thickness of the alloy film material, such that the surface roughness is kept low and controlled. By using etch annealing, the final surface roughness can be reduced by approximately fifty percent or more and the dislocation density is reduced by approximately two orders of magnitude compared to a conventional anneal process.

BRIEF DESCRIPTION OF THE DRAWINGS

The present invention is illustrated by way of example and not by way of limitation, in the figures of the accompanying drawings and in which like reference numerals refer to similar elements and in which:

FIG. 1 shows a flow diagram of a conventional art process for controlling the surface roughness and dislocations of a semiconductor material.

FIG. 3A shows a sectional view of a strained semiconductor layer having an initial surface roughness, according to the conventional art.

FIG. 3B shows a sectional view of a relaxed semiconductor layer having a substantially higher surface roughness and dislocation density after an annealing step, according to the conventional art.

FIG. 3C shows a sectional view of a semiconductor layer having a planar surface after a CMP process is performed on the conventionally annealed surface, according to the convention art.

FIG. 2 shows a flow diagram of a process for controlling the surface roughness and dislocations of a semiconductor material in accordance with one embodiment of the present invention.

FIG. 4A shows a sectional view of a strained semiconductor layer having an initial surface roughness, according to the conventional art.

FIG. 4B shows a section view of a relaxed semiconductor layer having a planar surface and reduced dislocation density after performing a method according to one embodiment of the present invention.

FIG. 4C shows a section view of a device layer deposited onto the relaxed semiconductor layer made using a method according to one embodiment of the present invention.

FIG. 5A shows an experimental resulting surface roughness according to the conventional art.

FIG. 5B shows an experimental resulting surface roughness in accordance with one embodiment of the present invention.

FIG. 6A shows an experimental resulting dislocation defect density according to the conventional art.

FIG. 6B shows an experimental resulting dislocation defect density in accordance with one embodiment of the present invention.

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Referring to FIG. 2, a flow diagram of a process for controlling the surface roughness and reducing dislocations of a strained SiGe alloy film in accordance with one embodiment of the present invention is shown. As depicted in FIG. 2, the process begins with a wafer where a strained SiGe alloy layer having a surface with a substantially planar surface with few as-grown dislocations, at step 210. The roughness is low since the as-grown wafer is close to being or is fully strained and has not been subjected to thermal cycles that would have started the relaxation process. At step 220, the surface is "etch annealed" utilizing, for example, an epitaxial chamber subjecting the wafer to a high temperature anneal in an etching ambient. A similar process has been shown to smooth unstrained films in a process referred to as an "epi-smoothing" process. The epi-smoothing process is disclosed in U.S. Pat. No. 6,287,941, granted Sep. 11, 2001, entitled "Surface Finishing of SOI Substrates Using an EPI Process," which is incorporated by reference herein. Since the etching process applied to relaxing strained films controls the overall roughness rather than smoothes the surface, it will hereinafter called "etch annealing."

The etch annealing process comprises subjecting the surface of the strained semiconductor material to an etchant including a halogen bearing compound such as HCl, HF, HI, HBr, $SF_6$, $CF_4$, $NF_3$, $CCl_2F_2$, or the like. The etch annealing process is performed at an elevated temperature of 700-1200° C., or greater. The concurrent use of an etchant and a temperature sufficient to relax the strained SiGe film has been found to help reduce or eliminate the generation of dislocations with a concurrent reduction in relaxation roughening of the surface. This favorable effect is believed linked to a reduction of the stress inducing cycloidic cusp tips present during a non-etch anneal (H. Gao & W. D. Nix, "Surface Roughening of Heteroepitaxial Thin Films", Annu. Rev. Mater. Sci. 1999, 29, pg. 173-209). In the work by Gao and Nix, it is explained that the strain caused by the lattice mismatch drives the generation of an undulating profile on the surface that has periodic sharp cusp tips that favor the creation of dislocations at these highly stressed locations. The concurrent etching process during film relaxation is believed to significantly blunt or round the cusp tips that reduce the stress concentration and thus reduces the surface dislocation density by affecting its creation kinetics. The surface roughening is also disfavored by the etch ambient.

The etch annealing process may be performed at a range of elevated temperatures that would favor the concentration of the dislocations away from the surface to relax the lattice structure of the SiGe layer. The thermal treatment may be from a resistance heater, RF heater, high intensity lamps, or the like. The thermal treatment means should be capable of heating the semiconductor material at a rate of approximately 10-20° C./sec, or more.

Because the strained film growth, step 210, is made within an epitaxial reactor and the etch annealing step 220 is also made within the same system, repetition of these steps is straightforward and the general economy of the process can be fully appreciated since no cleans, external anneals or CMP planarization steps are needed. The subsequent growth of the device layer 330 can also be made in-situ within the same epitaxial reactor, further improving the efficiency and cost of the process.

The etch annealing process removes strained semiconductor material in a manner that blunts sharpening (roughening) features that form on the surface upon film relaxation. The rate of etching is a function of time, temperature, and the etchant type and concentration. Therefore, controlling these parameters during the etch annealing process controls the amount of etching. The etch annealing process is performed until the process reduces surface roughness by approximately fifty percent or more compared to an anneal without the etchant. Thus, the etch annealing process acts to control surface roughening during film relaxation sufficient for subsequent semiconductor device fabrication processes. The method also provides the added benefit of reducing dislocations by up to two orders of magnitudes or more.

Furthermore, unlike convention CMP processes that are limited to removing a few tens of nano-meters or less, the etch annealing process can be used to remove as much as a few hundreds of nano-meters or more of semiconductor material.

The etch annealed semiconductor layer 320 may be utilized for fabricating additional layers thereupon or device regions therein. The reduced dislocation density of the resulting semiconductor layer 330 advantageously results in higher carrier mobility. The higher carrier mobility improves characteristics of devices, such as field effect transistors, bipolar transistors, and the like.

In an exemplary implementation, the process begins at step 210 with a semiconductor layer of single crystalline silicon-germanium (SiGe). The as-grown strained silicon-germanium layer has a roughness of approximately 2 Angstroms root-mean-square (RMS), and less than approximately 1 dislocations/$cm^2$.

At steps 220, the surface of the silicon-germanium layer is exposed to a hydrogen-chloride containing gas, at an elevated temperature of 700-1200° C., in an etch annealing process, such that:

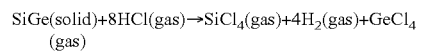

This process is substantially the reversal of an epitaxial deposition process for growing a silicon-germanium layer. The difference being that if the concentration of hydrogen chloride is too high, the wafer surface is etched instead of silicon-germanium being deposited. The etch annealing process removes silicon-germanium concurrently with the strain relaxation process and has been shown to help mitigate the undesirable emergence of dislocations and surface roughening. Thus, the etch annealing process acts to control surface roughening and lower dislocation density while achieving substantially complete film relaxation.

In one embodiment of the invention as illustrated in FIGS. 4A-C, the etch annealing process yields a less costly alternative than the conventional art by allowing for a usable strained silicon device layer without costly external planarization steps. In FIG. 4A, a strained SiGe layer 410 is grown on a base silicon wafer 420 having a low surface roughness 430 of approximately 1-2 Angstrom RMS and a unrelaxed, low dislocation defect density 440 on the order of 1 dislocations/$cm^2$ or less.

As illustrated in FIG. 4B, the etch annealing process, according to one embodiment of the present invention, generally controls the surface roughness 450 to approximately 2-10 Angstroms RMS. One skilled in the art would expect that etch annealing would not affect the generation of the dislocation process. However, the etch annealing process results in the unexpected benefit of decreasing the dislocation density to approximately $10^5$ dislocations/cm$^2$, as compared to an anneal made without an etch ambient of approximately $10^7$ dislocations/cm$^2$. The etch annealing process is also highly effective in fully relaxing the film, rendering it suitable as a base to grow a strained silicon device film 470 as shown in FIG. 4C.

The resulting relaxed semiconductor layer can be utilized for fabricating semiconductor layers thereupon or device regions therein. The reduced dislocation nature of the semiconductor layer advantageously results in higher carrier mobility. The high carrier mobility in the semiconductor layer improves characteristics of the devices formed therein.

Referring now to FIGS. 5A-5B and FIGS. 6A-6B, these images illustrate the experimental results achievable by a method in accordance with one embodiment of the present invention, and should not limit the scope of the claims herein. In this example, the initial SiGe layer was a 1500A thick constant composition silicon-germanium layer (25% Germanium content) grown at 680 C. All as-grown wafers showed a sub-nm RMS surface roughness prior to thermal or etch anneal treatments. All as-grown wafers were also shown to be largely unrelaxed while after the etch anneal or thermal treatment at 1100 C, the samples were found to be relaxed to a level exceeding 90%.

Generally, the relaxation or strain state of SiGe layers on Si substrates was determined by grazing incidence/grazing exit Xray reflections from (224) planes using high-resolution X-ray diffraction (HRXRD). For a SiGe layer on a Si substrate, the degree of relaxation is determined from a comparison of the angular shift of the two reflections from the Si substrate reflection. For a 100% relaxed structure, the SiGe lattice will be fully cubic and the two SiGe (224) reflections (grazing incidence and grazing reflection) will be shifted by the identical angle from the Si substrate reflection. As strain increases the difference in these shifts increases. Typical values of relaxation percent for a Si—Ge (25%) layer exposed to a 1100 C thermal treatment for 300 seconds is well over 90%, where percentage relaxation is given by:

$$\text{Relax\%} = \frac{a_{SiGe} - a_{Si}}{a_{SiGe}^{Re} - a_{Si}} * 100$$

where $a_{SiGe}$ and $a_{Si}$ are the lattice constants of Si and SiGe respectively. The Re indicates fully relaxed.

As depicted in FIG. 5A, one wafer was thermally annealed at 1100 C for 300 seconds and showed a post-thermal roughness exceeding 60 Angstroms RMS, considered too high for device processing. In this context, roughness is simply defined as the standard deviation of the surface height of the wafer. This is usually referred to as the root-mean-square (RMS) roughness. The roughness was measured using a Digital Instrument Tapping Mode Automatic Force Microscope (AFM) measured on a 2 micron square area. The RMS roughness is calculated from the standard deviation of the height or z values taken from AFM images of the wafer surface. FIG. 5B shows the AFM measurement of a similar starting sample subjected to a 1100 C, 300 second etch anneal process. The RMS roughness of this sample was measured to be about 6 Angstroms, over 10 times lower than the equivalent thermal treatment without etch annealing.

In these experiments, the surface was subjected to the thermal and etch annealing processes using an Applied Materials single-wafer atmospheric "epi" chamber called the Epi Centura™. The chamber has two modules with radial lamp arrays to provide radiant heat to the sample silicon-germanium. The chamber includes a closed-loop temperature control which utilizes two optical pyrometers capable of providing independent temperature measurement of both the sample and the susceptor therein. The chamber temperature was ramped from the growth temperature at a controlled rate and then maintained at approximately 1100° C. for 300 seconds. The gas introduced into the chamber was $H_2$ gas for the thermal anneal treatment and a mixture of HCl and $H_2$ gases for the etch anneal treatment. The HCl flow rate for the etch anneal treatment was less than 1 liter/minute, and the $H_2$ gas flow was approximately 100 liters/minute. The chamber pressure was generally maintained at approximately 1 atmosphere. Other parameters were controlled in a standard manner.

The mechanism of relaxation entails the formation of dislocations, which are line defects that are ideally confined to the Si SiGe interface and run parallel to it. These are referred to as misfit dislocations. However, in practical relaxation, many dislocations emerge from the surface as well. These are referred to as threading dislocations. They occur essentially because entropy opposes spontaneous deformation of the relaxing film only in directions parallel to the surface. Like all dislocations, threading dislocations are line defects, wherein the crystal lattice is locally distorted to accommodate plastic deformation of a crystal material. As such, the surface etch rate of Si or SiGe can be different in the vicinity of threading dislocations emerging from the surface due to strained or dangling bonds. To measure the dislocation defect density in this work, a dilute Schimmel (5 parts of 0.2 M $CrO_3$ and 4 parts of 49% hydrofluoric acid) was used to reveal threading dislocations that emerge from the surface. Each dislocation that extends to the surface exposed to this etch solution for 5 to 15 seconds results in an etch pit that can be viewed in an optical microscope that employs diffraction-interference-contrast (DIC), sometimes referred to as a Nomarski microscope. The number of pits within a known field of view per unit area is defined as the density of dislocations.

The samples processed as described above (5A and 5B) were then decorated for dislocation defect density using a Schimmel etch. As depicted in FIG. 6A, the sample treated according to the conventional art showed a schimmel etch dislocation defect density exceeding $10^6$ dislocations/cm$^2$. The etch annealed sample was similarly decorated and showed a much lower dislocation defect density of less than $5 \times 10^4$ dislocations/cm$^2$.

These results clearly show the significant quality and cost advantages that etch annealing brings to the process of fabricating a relaxed lattice mismatched semiconductor layer onto a base wafer.

The experimental results are merely exemplary, and should not limit the scope of the claims herein. One of ordinary skill in the art would recognize that many other variations, alternatives, and modifications can be made. For example, the process can be carried out at different temperatures, different pressures, flow rates, utilizing different chemicals, and the like, without departing from the scope of the claimed invention.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of fabricating a semiconductor comprising:
heating a strained semiconductor material; and
upon the heated strained semiconductor material reaching about 700° C.; annealing the heated strained semiconductor material in an etching ambient sufficient to relax the strained semiconductor material and to minimize increases in surface roughness and defect density.

2. The method of claim 1 further comprising:
growing a second semiconductor material over said relaxed semiconductor material.

3. The method of claim 2, wherein said second semiconductor material comprises a first lattice constant and said relaxed semiconductor material comprises a second lattice constant which is different than said first lattice constant.

4. The method of claim 1, wherein said surface roughness is reduced by at least approximately fifty percent as compared to surface roughness without said etching ambient being present during said annealing.

5. The method of claim 1, wherein dislocation density in said semiconductor material is reduced by approximately two orders of magnitude as compared to dislocation density without said etching ambient being present.

6. The method of claim 1, wherein etch annealing said surface of said semiconductor material comprises exposing said semiconductor material to an etch ambient comprising a halogen bearing etchant.

7. The method of claim 6, wherein said halogen bearing etchant is hydrogen chloride.

8. The method of claim 6, wherein said halogen bearing etchant is hydrogen fluoride.

9. The method of claim 6, wherein etch annealing said surface of said semiconductor material further comprises exposing said semiconductor material to hydrogen.

10. The method of claim 6, wherein etch annealing said surface of said semiconductor material further comprises increasing a temperature of said semiconductor material to between 700 and 1200 degrees Celsius.

11. A method of minimizing dislocations in a semiconductor material comprising:
heating a strained semiconductor material; and
upon the heated strained semiconductor material reaching about 700° C.; etch annealing the heated strained semiconductor material, wherein a relaxed semiconductor material is produced.

12. The method of claim 11 further comprising:
growing a second semiconductor material over said relaxed semiconductor material.

13. The method of claim 12, wherein said second semiconductor material comprises a first lattice constant and said relaxed semiconductor material comprises a second lattice constant which is different than said first lattice constant.

14. The method of claim 11, wherein said roughness of said surface of said semiconductor material is reduced by at least fifty percent as compared to roughness using an inert ambient thermal anneal.

15. The method of claim 11, wherein dislocations in said semiconductor material are reduced by at least two orders of magnitude as compared to using an inert ambient thermal anneal.

16. The method of claim 15, wherein etch annealing said surface of said semiconductor material comprises exposing said semiconductor material to an etch ambient comprising a halogen bearing etchant.

17. The method of claim 16, wherein said halogen bearing etchant is hydrogen chloride.

18. The method of claim 16, wherein said halogen bearing etchant is hydrogen fluoride.

19. The method of claim 17, wherein etch annealing said surface of said semiconductor material further comprises exposing said semiconductor material to hydrogen.

20. The method of claim 16, wherein etch annealing said surface of said semiconductor material further comprises increasing a temperature of said semiconductor material to between 700 and 1200 degrees Celsius.

* * * * *